US010199367B2

(12) United States Patent
Schmitt et al.

(10) Patent No.: US 10,199,367 B2
(45) Date of Patent: Feb. 5, 2019

(54) SEMICONDUCTOR DEVICE (71) Applicant: Infineon Technologies Dresden GmbH, Dresden (DE)

(72) Inventors: Markus Schmitt, Neubiberg (DE); Armin Tilke, Dresden (DE); Joachim Weyers, Hoehenkirchen (DE)

(73) Assignee: Infineon Technologies Dresden GmbH, Dresden (DE)

( * ) Notice: Subject to any disclaimer, the term of this patent is extended or adjusted under 35 U.S.C. 154(b) by 130 days.

(21) Appl. No.: 15/458,265

(22) Filed: Mar. 14, 2017

(65) Prior Publication Data

US 2017/0271319 A1 Sep. 21, 2017

(30) Foreign Application Priority Data

Mar. 15, 2016 (DE) ........................ 10 2016 104 796

(51) Int. Cl.
*H01L 27/02* (2006.01)
*H01L 23/535* (2006.01)
(Continued)

(52) U.S. Cl.
CPC ...... *H01L 27/0255* (2013.01); *H01L 23/4824* (2013.01); *H01L 23/535* (2013.01);
(Continued)

(58) Field of Classification Search
CPC ............. H01L 27/0255; H01L 29/7396; H01L 29/0634; H01L 29/7811; H01L 23/4824;
H01L 29/7808; H01L 29/0611; H01L 27/0292; H01L 23/535; H01L 29/04; H01L 29/0649; H01L 29/7397; H01L 29/0615

See application file for complete search history.

(56) References Cited

U.S. PATENT DOCUMENTS 7,511,357 B2     3/2009  Hshieh
2003/0057497 A1* 3/2003  Higashida ........... H01L 27/0255
                                                    257/356

(Continued)

FOREIGN PATENT DOCUMENTS

DE     202004021424 U1    2/2008

*Primary Examiner* — Kyoung Lee
(74) *Attorney, Agent, or Firm* — Murphy, Bilak & Homiller, PLLC (57) ABSTRACT

A semiconductor device includes a semiconductor body having opposite first and second surfaces. The semiconductor device further includes a transistor structure in the semiconductor body and a source contact structure overlapping the transistor structure. The source contact structure is electrically connected to source regions of the transistor structure. A gate contact structure is further provided, which has a part separated from the source contact structure by a longitudinal gap within a lateral plane. Gate interconnecting structures bridge the longitudinal gap and are electrically coupled between the gate contact structure and a gate electrode of the transistor structure. Electrostatic discharge protection structures bridge the longitudinal gap and are electrically coupled between the gate contact structure and the source contact structure. At least one of the gate interconnecting structures is between two of the electrostatic discharge protection structures along a length direction of the longitudinal gap.

20 Claims, 10 Drawing Sheets

(51) Int. Cl.
*H01L 29/04* (2006.01)
*H01L 29/06* (2006.01)
*H01L 23/482* (2006.01)
*H01L 29/78* (2006.01)
*H01L 29/739* (2006.01)
*H01L 29/16* (2006.01)
*H01L 29/861* (2006.01)
*H01L 29/866* (2006.01)

(52) U.S. Cl.
CPC .......... *H01L 27/0292* (2013.01); *H01L 29/04* (2013.01); *H01L 29/0611* (2013.01); *H01L 29/0634* (2013.01); *H01L 29/0649* (2013.01); *H01L 29/7396* (2013.01); *H01L 29/7808* (2013.01); *H01L 29/7811* (2013.01); *H01L 29/0615* (2013.01); *H01L 29/0638* (2013.01); *H01L 29/16* (2013.01); *H01L 29/7397* (2013.01); *H01L 29/861* (2013.01); *H01L 29/866* (2013.01)

(56) References Cited

U.S. PATENT DOCUMENTS

| | | |
|---|---|---|
| 2008/0258224 A1 | 10/2008 | Hshieh |
| 2008/0290367 A1 | 11/2008 | Su et al. |
| 2015/0294966 A1 | 10/2015 | Mauder et al. |

\* cited by examiner

SEMICONDUCTOR DEVICE

BACKGROUND

A key component in semiconductor application is a solid-state switch. As an example, switches turn loads of automotive applications or industrial applications on and off. Solid-state switches typically comprise, for example, field effect transistors (FETs) like metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is therefore desirable to provide a semiconductor device structure with enhanced ESD protection characteristic and optimized area efficiency.

SUMMARY

According to an embodiment, a semiconductor device comprises a semiconductor body having a first surface and a second surface opposite to the first surface. The semiconductor device further comprises a transistor structure in the semiconductor body. A source contact structure is overlapping the transistor structure. The source contact structure is electrically connected to source regions of the transistor structure. A gate contact structure is further provided, which has a part separated from the source contact structure by a longitudinal gap within a lateral plane. Gate interconnecting structures bridge the longitudinal gap and are electrically coupled between the gate contact structure and a gate electrode of the transistor structure. Electrostatic discharge protection structures bridge the longitudinal gap and are electrically coupled between the gate contact structure and the source contact structure. At least one of the gate interconnecting structures is between two of the electrostatic discharge protection structures along a length direction of the longitudinal gap.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low ohmic connection between electrically connected elements, for example a direct contact between the concerned elements or a low-ohmic connection via a metal and/or highly doped semiconductor. The term "electrically coupled" includes that one or more intervening element (s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
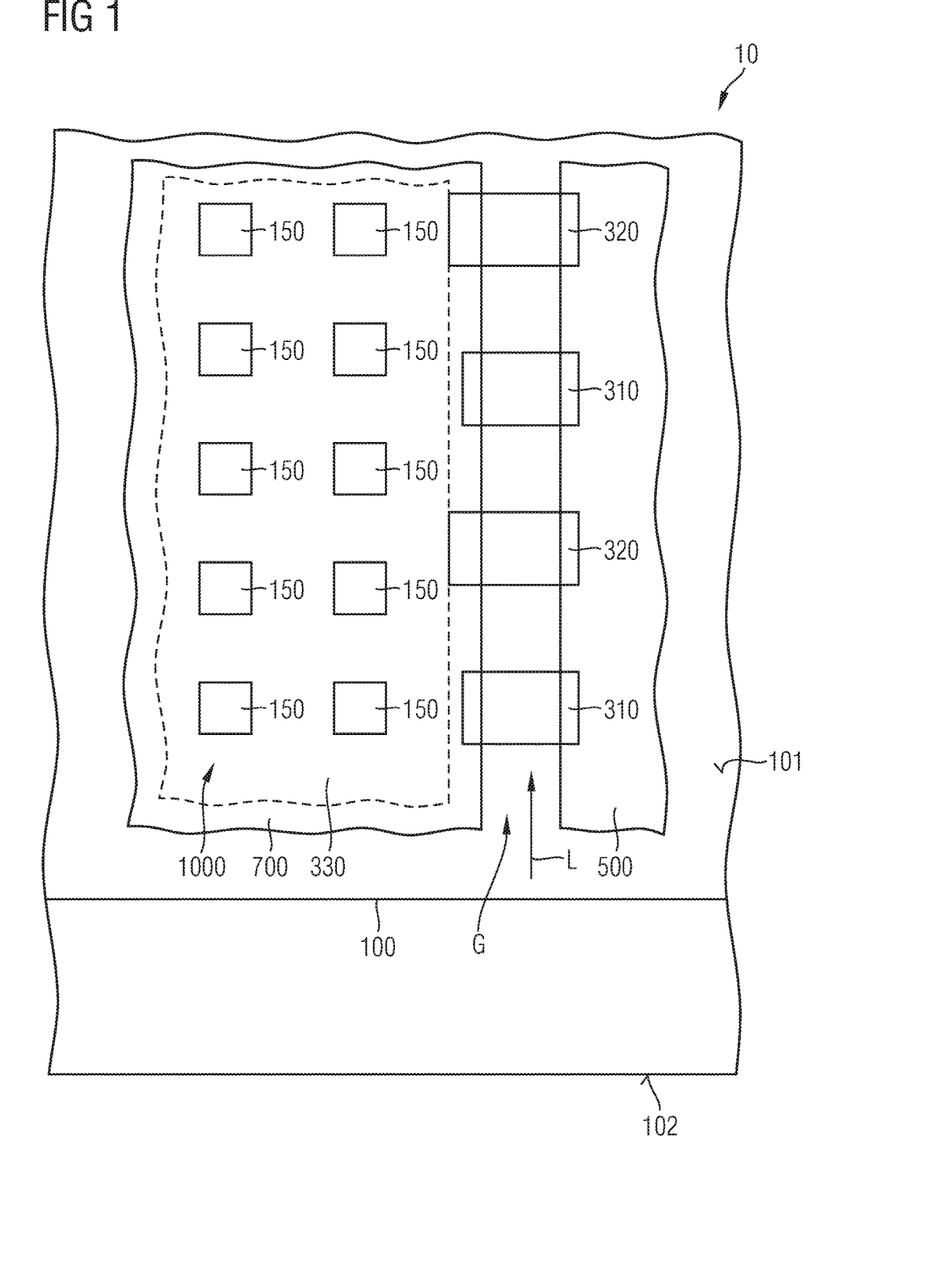
FIG. 1 is a schematic perspective view of a portion of a semiconductor device in accordance with an embodiment.

FIG. 1 is a schematic perspective view of a portion of a semiconductor device in accordance with an embodiment.

The semiconductor device 10 comprises a semiconductor body 100 having a first surface 101 and a second surface 102 opposite to the first surface 101. The semiconductor device 10 further comprises a transistor structure 1000 in the semiconductor body 100. A source contact structure 700 is provided, which overlaps the transistor structure 1000. The source contact structure 700 is electrically connected to source regions 150 of the transistor structure 1000. The source contact structure may comprise a source pad. A gate contact structure 500 is provided, which has a part separated from the source contact structure 700 by a longitudinal gap G within a lateral plane. Gate interconnecting structures 320 bridge or overlap the longitudinal gap G and are electrically coupled between the gate contact structure 500 and the gate electrode 330 of the transistor structure 1000. In addition, electrostatic discharge protection structures 310 are provided, which bridge or overlap the longitudinal gap G. The electrostatic discharge protection structures 310 are electrically coupled between the gate contact structure 500 and the source contact structure 700. At least one of the gate interconnecting structures 320 is between two of the electrostatic discharge protection structures 310 along the length direction L of the longitudinal gap G.

By providing at least one of the gate interconnecting structures 320 between two of the electrostatic discharge protection structures 310 along the length direction L of the longitudinal gap G, a gate current from the gate contact structure 500 via the gate interconnecting structures 320 to the gate electrode 330 can still distribute homogenously all over the active area of the gate electrode 330, while maximizing, at the same time, the total diode width of the electrostatic discharge protection structures 310. According to an embodiment, at least one of the electrostatic discharge protection structures 310 may be between two of the gate interconnecting structures 320 along the length direction L of the longitudinal gap G.

Figure 2:
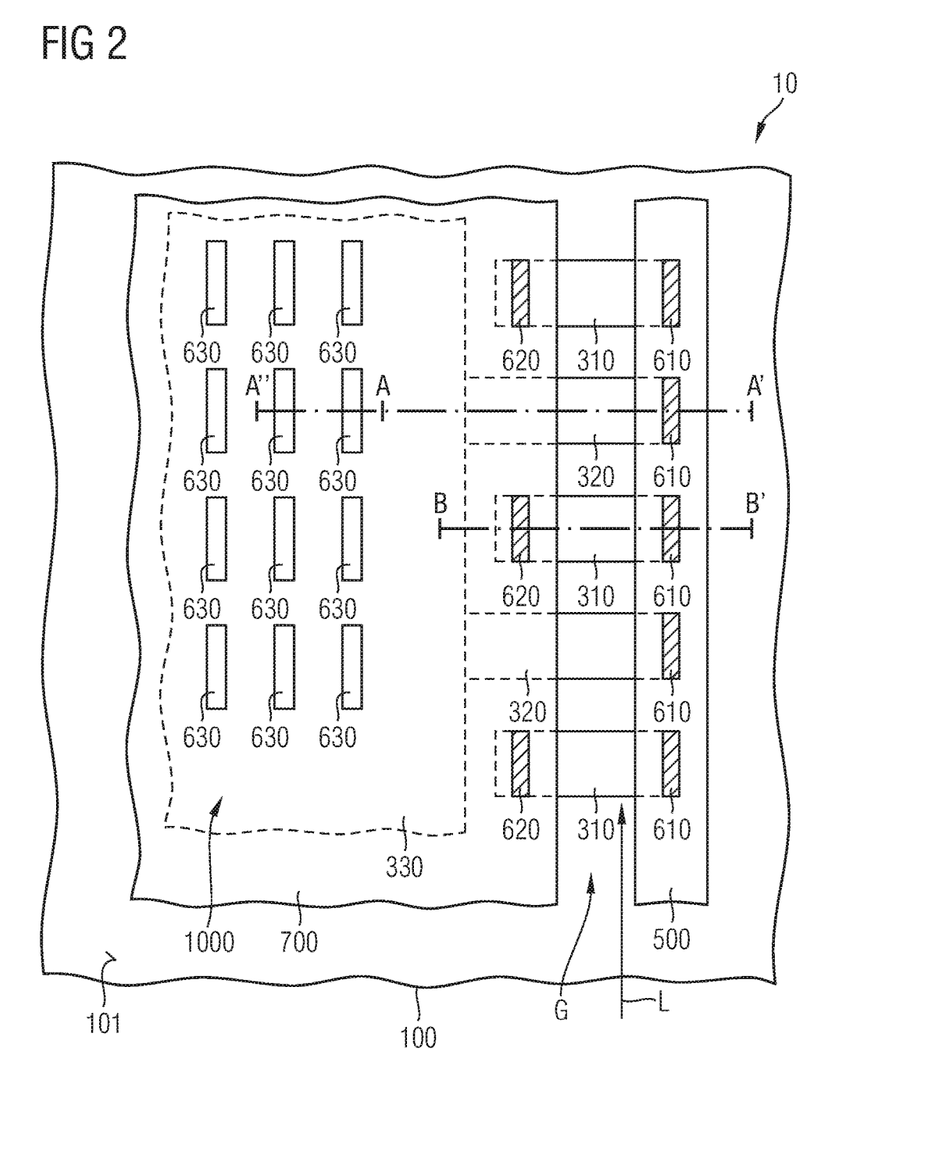
FIG. 2 is a schematic plan view of a portion of a semiconductor device in accordance with an embodiment.

FIG. 2 is a schematic plan view of a portion of the semiconductor device 10 in accordance with an embodiment.

The semiconductor device 10 may comprise power semiconductor elements such as IGBTs (insulated gate bipolar transistors), e.g. RC-IGBIs (reverse-conducting IGBTs), RB-IGBT (reverse-blocking IGBTs), and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a gate terminal. When reducing the chip size of the semiconductor device 10, a smaller input capacitance results in an enhanced risk of damage caused by an electrostatic discharge event between the gate and the source of the semiconductor device 10.

In the plan view of FIG. 2, the longitudinal gap G is extended between an edge portion of the source contact structure 700 and an edge portion of the gate contact structure 500. The normal to the first and second surfaces 101, 102 defines a vertical direction and directions orthogonal to the normal direction are lateral directions within the lateral plane. The longitudinal gap G is extended along the length direction L, wherein the length direction L of the longitudinal gap G has to be understood as a direction parallel to a straight line, which does not cross parts of the source contact structure 700 and/or the gate contact structure 500 in a lateral plane. In other words, the longitudinal gap G has a bigger extension in a lateral plane parallel to edge portions of the source contact structure 700 and the gate contact structure 500 in comparison to its extension along a direction orthogonal to or facing the edge portions of the source contact structure 700 and the gate contact structure 500.

Figure 3:
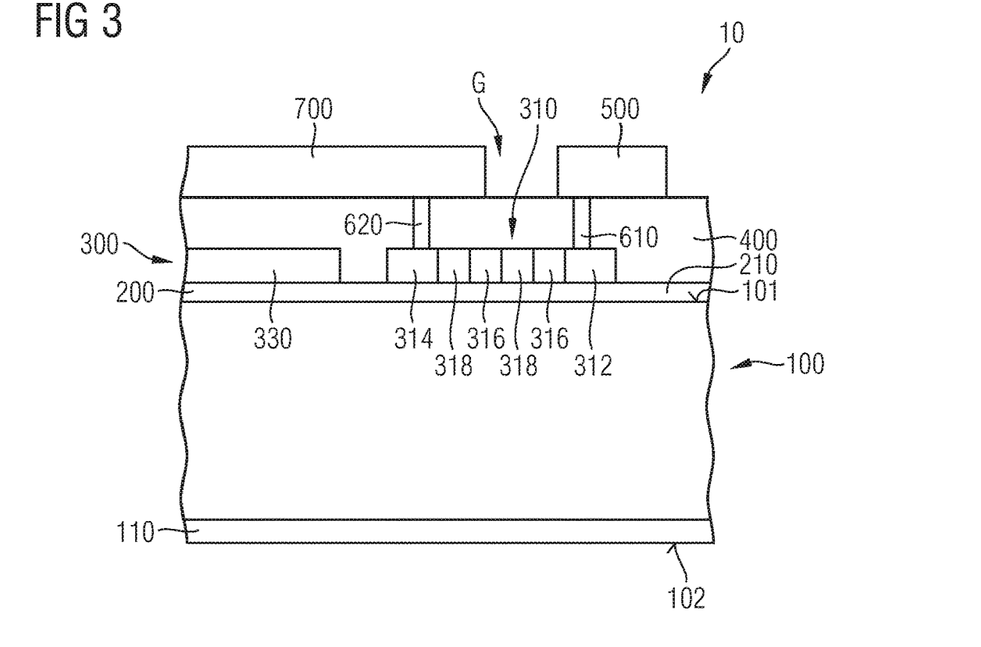
FIGS. 3 to 5 are schematic cross-sectional views of portions of a semiconductor device taken along the section planes B-B', A-A', and A-A" of FIG. 2, respectively.
Figure 4:
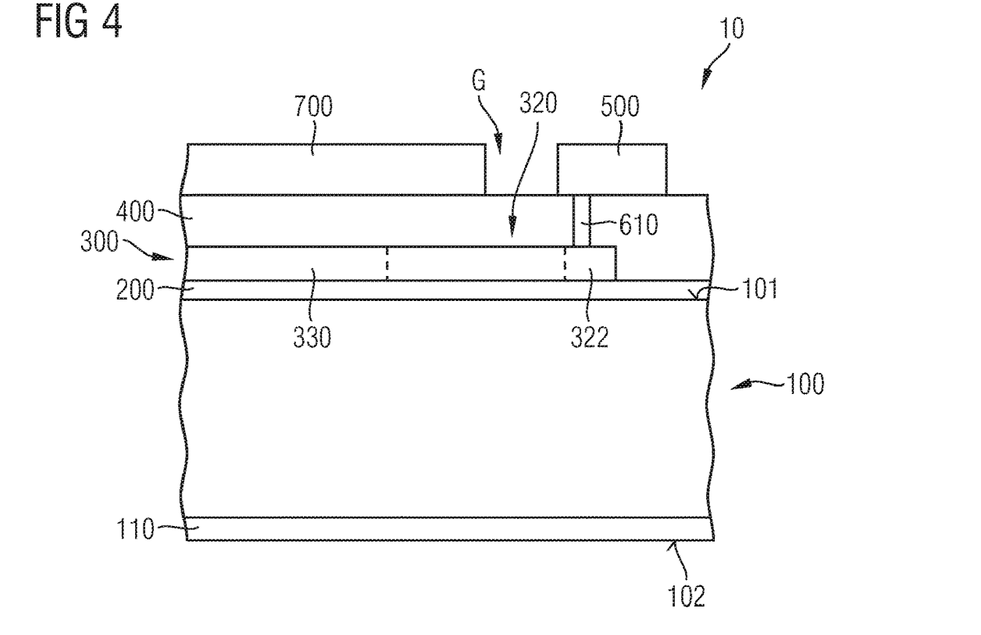

FIGS. 3 and 4 are schematic cross-sectional views of portions of a semiconductor device taken along the section planes B-B' and A-A' of FIG. 2, respectively.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 5 µm, or may be at least 20 µm, for example at least 50 µm. Other embodiments may provide a semiconductor body 100 with a thickness of several 100 µm. The semiconductor body 100 may have a rectangular shape with an edge length in the range of 500 µm up to several millimeters.

Figure 5:
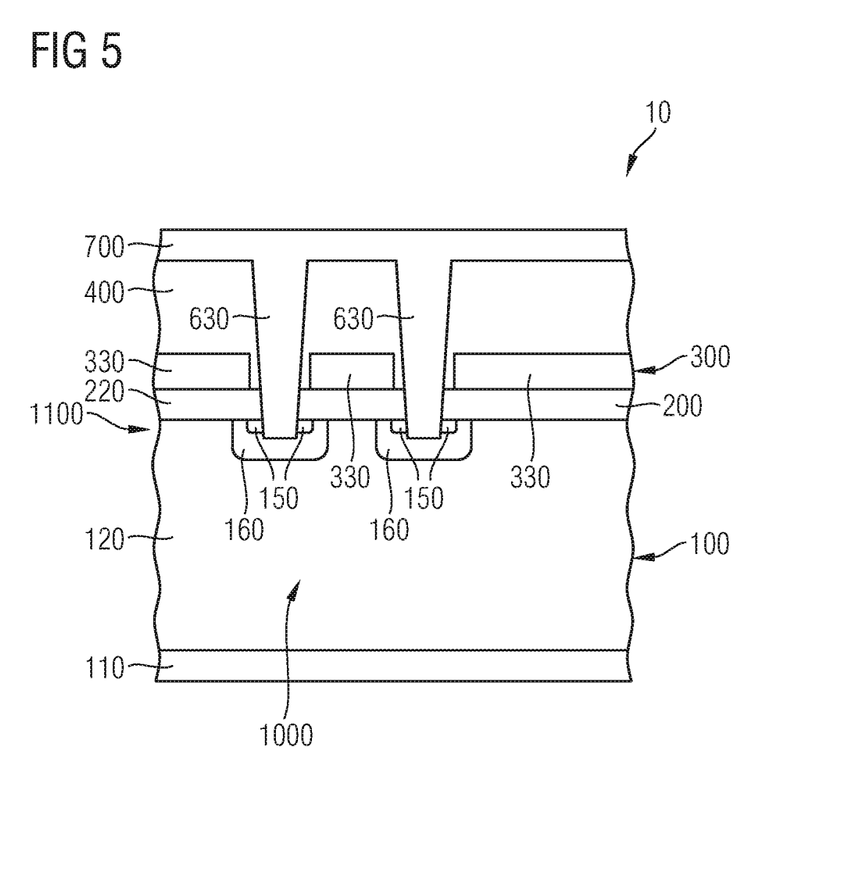

The semiconductor body 100 may comprise, as will be further described in view of FIG. 5, a drain region 110 and a drift region 120. The semiconductor device 10 may comprise a first isolation layer 200 on the first surface 101 of the semiconductor body 100, wherein the electrostatic discharge protection structures 310 and the gate interconnection structures 320 are abutting the first isolation layer 200. The first isolation layer 200 may be formed on the first surface 101 of the semiconductor body 100. The first isolation layer 200 may include any dielectric or a combination of dielectrics adapted to isolate the semiconductor body 100 from the electrostatic discharge protection structures 310, the gate interconnecting structures 320 or the gate electrode 330 on the first isolation layer 200. The first isolation layer 200 may include one or any combination of an oxide, nitride, oxynitride, a high-k material, an imide, an insulating resin or glass, for example. The first isolation layer 200 may include a field oxide formed e.g. by thermal oxidation or deposition or by a local oxidation of silicon (LOGOS) process or STI (shallow trench isolation).

As can be seen from FIGS. 3 and 4, the first isolation layer 200 may comprise a field dielectric layer 210. In particular, the first isolation layer 200 may include a field dielectric, such as a field oxide in an overlap area between the electrostatic discharge protection structures 310 or the gate interconnecting structures 320 and the semiconductor body 100 and may further include a gate dielectric such as a gate oxide in an overlap area between the source contact structure 700 and the semiconductor body 100 within an area of the transistor structure 1000. The thickness of the field dielectric of the first isolation layer 200 may be in a range of 0.5 µm to 5 µm or 1 µm to 3 µm, the thickness of the gate dielectric of the first isolation layer 200 may be in a range of 5 nm to 200 nm or 40 nm to 120 nm.

The semiconductor device 10 may further comprise a second isolation layer 400 on the electrostatic discharge protection structures 310 and the gate interconnecting' structures 320, wherein the source contact structure 700 and the gate contact structure 500 are formed on the second isolation layer 400. The second isolation layer 400 may be formed on the electrostatic discharge protection structures 310, the gate interconnecting structures 320 and the gate electrode 330. The second isolation layer 400 may comprise a stack of dielectric layers. Herein, a first dielectric layer of the second isolation layer 400 may include a tetraethylorthosilicate (TEOS)/undoped silicate glass (USG) film. The thickness of the first dielectric layer of the second isolation layer 400 may be in a range of 50 nm to 500 nm. A second dielectric layer of the second isolation layer 400 may include a phosphosilicate glass (PSG) or a borophosphosilicate glass (BPSG). The thickness of the second dielectric layer of the second isolation layer 400 may be in a range of 200 nm to 2 µm.

The gate contact structure 500 may be formed on the second isolation layer 400. Next to the gate contact structure 500, the source contact structure 700 may be formed on the second isolation layer 400, which is spaced apart from a part of the gate contact structure 500 by the longitudinal gap G. On the gate contact structure 500 and the source contact structure 700, a further passivation layer may be formed, which may include one or any combination of an imide, a nitride, an oxide or an oxynitride, for example.

As can be further seen from FIGS. 3 and 4, first terminals 312 of the electrostatic discharge protection structures 310 and terminals 322 of the gate interconnecting structures 320 may be electrically connected with the gate contact structure 500 by a first electric contact structure 610. In addition, second terminals 314 of the electrostatic discharge protection structures 310 may be electrically connected with the source contact structure 700 by second electric contact structures 620. The first and second electric contact structures 610, 620 may extend along a vertical direction through the second isolation layer 400. As can be seen from FIG. 5, third electric contact structures 630 may be provided to interconnect the source contact structure 700 with the source regions 150 of the transistor structure 1000.

The gate contact structure 500 may comprise a metal. In addition, the source contact structure 700 may comprise a metal. The source contact structure 700 and the gate contact structure 500 may be patterned parts of a same conductive material. The gate contact structure 500 and the source contact structure 700 may be separate parts, e.g. due to lithographic patterning, of a common metal wiring layer or stacked layer. The gate contact structure 500 and the source contact structure 700 may be formed as a metal layer structure including the first to third electric contact structures 610, 620 and 630. Such a metal layer structure may consist of or contain, as main constituent(s), aluminum Al, copper Cu or alloys of aluminum or copper, for example AlSi, AlCu, or AlSiCu. According to other embodiments, the gate contact structure 500 and the source contact structure 700 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, Pd and/or Co.

The gate interconnecting structures 320 may comprise a polysilicon layer 300. Herein, the gate interconnecting structures 320 and the electrostatic discharge protection structures 310 may be distinct parts of a same patterned polysilicon layer 300. It is, however, also possible that the gate interconnecting structures 320 and the electrostatic discharge protection structures 310 are formed in different depositing steps. As can be seen from the plan view of FIG. 2, the gate interconnecting structures 320 and the gate electrode 330 may be integrally formed as a same electrode layer of polysilicon. Herein, the gate interconnecting structures 320 may be formed as comb segments protruding from the electrode layer of the gate electrode 330 in the lateral plane. In such a structure, the electrostatic discharge protection structures 310 may be arranged between the gate interconnecting structures 320 constituting the comb segments protruding from the electrode layer of the gate electrode 330 in the lateral plane. The electrostatic discharge protection structures 310 and the gate interconnecting structures 320 are not necessarily arranged in an alternating order. However, at least one of the gate interconnecting structures 320 is between two of the electrostatic discharge protection structures 310 along the length direction L of the longitudinal gap G.

As can be seen from FIG. 3, the electrostatic discharge protection structures 310 may comprise the polysilicon layer 300 having first and second regions 316, 318 of opposite conductivity type alternatingly arranged along a lateral direction being perpendicular to the length direction L of the longitudinal gap G. Thus, the electrostatic discharge protection structures 310 may include at least one polysilicon diode having the first and second regions 316, 318 connected in series. Herein, the resulting diode may be bidirectional, having an odd number of first and second regions 316, 318, e.g. a n-p-n- . . . -p-n structure. The resulting diode may also be unidirectional, having an even number of first and second regions 316, 318, e.g. a n-p-n- . . . -p structure.

In detail, the electrostatic discharge protection structures 310 may be manufactured by forming the polysilicon layer 300 of a first conductivity type on the first isolation layer 200. After forming the polysilicon layer 300, a mask layer (not shown), e.g. a hard mask layer or a resist layer is formed on the polysilicon layer 300 and is patterned by a lithographic process, such that the second regions 318 are not covered by the mask layer. In a subsequent implantation process, dopants of a second conductivity type are introduced into the exposed second regions 318 not covered by the mask layer on the polysilicon layer 300, to form the second regions 318 of the second conductivity type. Thus, each of the first regions 316 and second regions 318 comprises first dopants of the first conductivity type, and the second regions 318 further comprise second dopants of the second conductivity type overcompensating the first dopants of the first conductivity type. In another embodiment, each of the first regions 316 may comprise first dopants of the first conductivity type and the second regions 318 may comprise second dopants of the second conductivity type only, without overcompensating the first dopants of the first conductivity type. Herein, the first dopants are introduced into the first regions 316 and the second dopants are introduced into the second regions 318, respectively, in a separate process, e.g. by ion implantation and/or diffusion, wherein overlapping regions between the first and second regions 316, 318 may comprise first and second dopants due to diffusion of the dopants.

As a result, a polysilicon diode chain or string arranged in a lateral direction having alternating pn-junctions (diodes) at the region boundaries of the first and second regions 316, 318 in the polysilicon layer 300 is formed. In an embodiment, the doping concentrations of the first and second regions 316, 318 are adapted such that a series connections of Zener diodes are formed within the polysilicon layer 300. By the number of consecutive diodes each including a first region 316 and a second region 318, the breakdown voltage of the electrostatic discharge protection structures 310 can be adjusted.

FIG. 5 is a schematic cross-sectional view of a portion of a semiconductor device 10 taken along the section plane A-A" of FIG. 2. As can be seen from FIG. 2, the part of the semiconductor device 10 taken along the section plane A-A" illustrates the transistor structure 1000 of the semiconductor device 10. The transistor structure 1000 comprises transistor cells 1100 arranged in an overlapping area between the source contact structure 700 and the semiconductor body 100. Each of the transistor cells 1100 comprise the gate electrode 330 formed on the first isolation layer 200 constituting a gate dielectric layer 220, the source regions 150 being in contact with the first surface 101 of the semiconductor body 100 and extending into the semiconductor body 100, and body regions 160, in which the source regions 150 are embedded. The source regions 150 are of the first conductivity type and the body regions 160 are of the second conductivity type. Furthermore, the drain region 110 of the first conductivity type is provided at the second surface 102 of the semiconductor body 100. The drift region 120 is formed between the drain region 110 and the body regions 160 and is of a first conductivity type. In case of a superjunction device, columns or bubbles of the first conductivity type and the second conductivity type can be implemented both beneath the active transistor cell field of the transistor structure 1000 and an edge termination area 900, as will be discussed in more detail with regard to FIGS. 9 and 10.

According to an embodiment, the gate electrode 330 is formed simultaneously with the gate interconnection structures 320 and may be part of the polysilicon layer 300. According to a further embodiment, the gate electrode 330 may be formed simultaneously with the gate interconnecting structures 320 and the electrostatic discharge protection structures 310 and may be part of the polysilicon layer 300. The third electric contact structure 630 may electrically couple the source regions 150 to the source contact structure 700.

As can be seen from FIGS. 2 to 5, a semiconductor device 10 is provided, in which the connection structure between a gate contact structure 500 and a gate electrode 330 is optimized in view of the electrostatic discharge protection capabilities. Due to the provision of a plurality of electrostatic discharge protection structures 310 and gate interconnecting structures 320, the total diode width being the summed up width of all electrostatic discharge protection structures 310 is maximized, wherein at the same time, a homogeneous distribution of gate current from the gate contact structure 500 to the gate electrode 330 is preserved.

According to an embodiment, at least two gate interconnecting structures 320 and at least three electrostatic discharge protection structures 310 may be arranged along the length direction L of the longitudinal gap G. According to another embodiment, at least three gate interconnecting structures 320 and at least four electrostatic discharge protection structures 310 may be arranged along the length direction L of the longitudinal gap G. According to yet another embodiment, at least four gate interconnecting structures 320 and at least five electrostatic discharge protection structures 310 may be arranged along the length direction L of the longitudinal gap G.

According to an embodiment, an extension of each of the electrostatic discharge protection structures 310 along the length direction L of the longitudinal gap G may be below 10000 µm, or may be below 1000 µm, or may be below 800 µm, or may be below 500 µm, or may be below 200 µm, or may be below 100 µm, or may be below 50 µm, or may be below 10 µm.

The gate interconnecting structures 320 and the electrostatic discharge protection structures 310 may have a same extension along the length direction L of the longitudinal gap G.

Although not shown in FIG. 2, the transistor structure 1000 may also be formed in an overlapping area between the gate contact structure 500 and the second surface 102 of the semiconductor body 100. That means that also the area under the gate contact structure 500 may be used as an active transistor and hence further reducing the total chip size.

Figure 6:
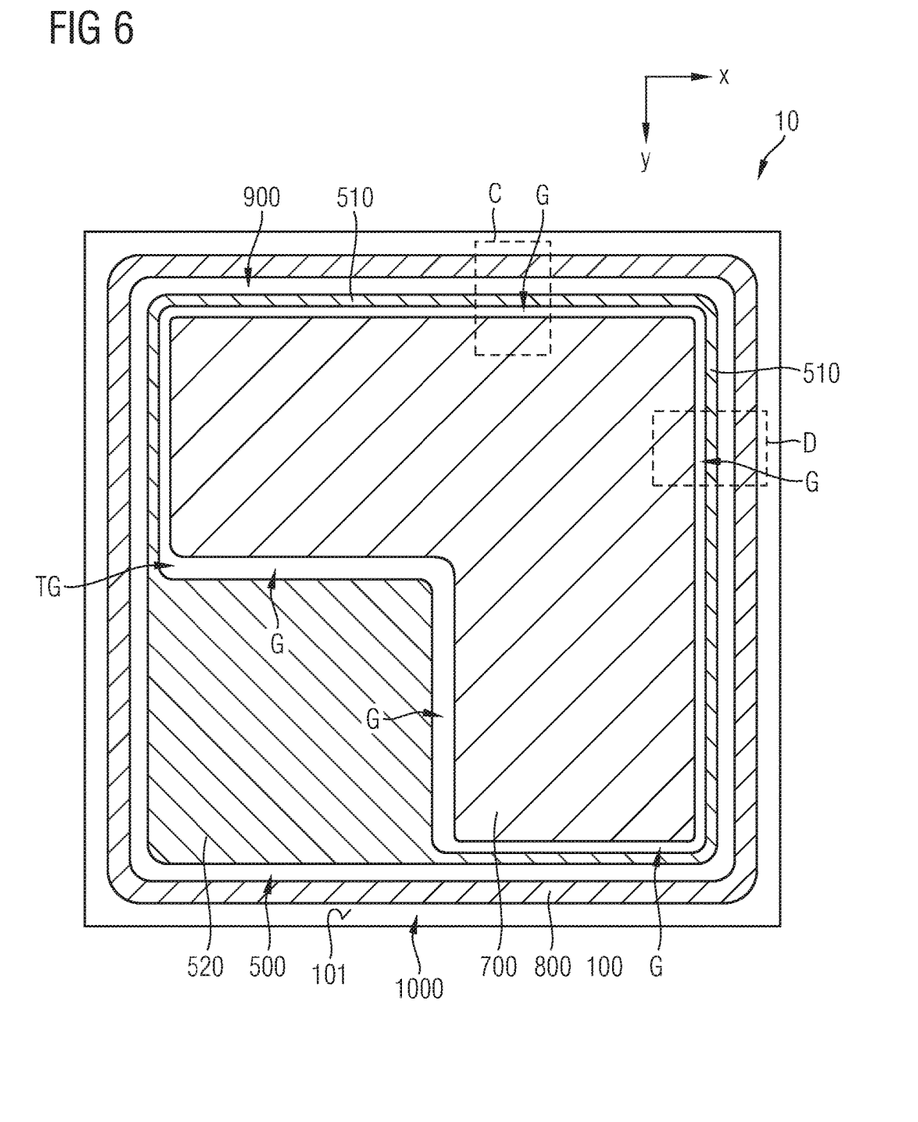
FIG. 6 is a schematic plan view of a portion of a semiconductor device in accordance with an embodiment.

FIG. 6 is a schematic plan view of a portion of the semiconductor device 10 in accordance with an embodiment. As can be seen from FIG. 6, the gate contact structure 500 may comprise a gate line 510 and a gate pad 520. The gate pad 520 and the gate line 510 may be formed of a metal. According to the embodiment of FIG. 6, the source contact structure 700, the gate contact structure 500 comprising the gate line 510 and the gate pad 520, as well as a drain line 800 may be formed as separate parts of a patterned metal wiring layer or metal wiring stacked layer.

As can be further seen from FIG. 6, there are different parts of the gate contact structure 500, in which a longitudinal gap G between the gate contact structure 500 and the source contact structure 700 may be formed. In the following, two detailed portions C and D will be explained hereinafter. However, it should be emphasized that the two described locations of the longitudinal gap G in the sections C and D shall not be understood as restrictive. Rather, the longitudinal gap G within the lateral plane parallel to the first surface 101 may be arranged between a part of the gate pad 520 and the source contact structure 700. However, as will be discussed in all detail later, the longitudinal gap G may also be arranged between a part of the gate line 510 and the source contact structure 700. The gate line 510 may be a so-called gate runner structure at an edge portion of the semiconductor device 10. The gate line 510 may, however, also be a gate finger structure arranged within a transistor cell array of the semiconductor device 10. According to an embodiment, the gate line 510 may surround at least partly the source contact structure 700 within the lateral plane. Herein, the longitudinal gap G may be formed in an edge termination area 900, as can be seen, for example in FIGS. 9 and 10.

As can be further seen from FIG. 6, there are six parts of the gate contact structure 500 and the source contact structure 700, at which longitudinal gaps G may be formed, since at these portions, the edge portions of the gate contact structure 500 and the source contact structure 700 are extended in a parallel direction. Furthermore, the gate contact structure 500 and the source contact structure 700 may be spaced apart equidistantly, leading to longitudinal gaps G having a constant extension along a direction orthogonal to the length direction L of a respective longitudinal gap G.

As can be seen from FIG. 6, the six longitudinal gaps G are connected to form a closed loop of longitudinal gaps G. The closed loop of gaps G form a total gap TG. The total gap TG is, however, not restricted to be a closed loop. The total gap TG may also comprise all parts of gaps or longitudinal gaps G, which are formed between the gate contact structure 500 and the source contact structure 700.

According to an embodiment, all longitudinal parts of the total gap TG may be used for implementing an alternating structure of gate interconnecting structures 320 and electrostatic discharge protection structures 310. Due to the concept of providing a plurality of electrostatic discharge protection structures 310 each having a diode width smaller than 50 µm, instead of employing a small number of electrostatic discharge protection structures 310 having a diode width greater than, for example, 100 µm, a homogeneous distribution of the gate current from the gate line 510 into the gate electrode 330 of the transistor structure 1000 may be achieved, while maximizing, at the same time, the total diode width of all electrostatic discharge protection structures 310 interconnected between the gate contact structure 500 and the source contact structure 700 along the total gap TG at parts of the gate contact structure 500, which form a longitudinal gap G with the source contact structure 700. The maximal length of a longitudinal gap G along an edge part of the semiconductor device 10 may be in a range between 500 µm and 10000 µm, the maximal length of the total gap TG may be in a range between 2000 µm and 40000 µm.

According to an embodiment, the ratio of total diode width of all electrostatic discharge protection structures 310 arranged along the total gap TG and the total width of all gate interconnecting structures 320 arranged along the total gap TG may be bigger than 30%, or may be bigger than 40%, or may be bigger than 50%, or may be bigger than 60%, or may be bigger than 70%, or may be bigger than 60%. The total diode width of the electrostatic discharge protection structures 310 shall be defined as the sum of all singular extensions along a direction parallel to the length direction L of a respective longitudinal gap G bridged by the respective electrostatic discharge protection structures 310 to be summed up over the total gap TG. The total width of all gate interconnecting structures 320 shall be defined as the sum of all singular extensions of gate interconnecting structures 320 along a direction parallel to the length direction L of a respective longitudinal gap G bridged by a respective gate interconnecting structure 320 within the total gap TG.

The number of gate interconnecting structures 320 arranged along the total gap TG, i.e. along all longitudinal gaps G between the gate contact structure 500 and the source contact structure 700, may be equal to or higher than 3, or may be equal to or higher than 5, or may be equal to or higher than 7, or may be equal to or higher than 10, or may be equal to or higher than 15, or may be equal to or higher than 20, or may be equal to or higher than 50, or may be equal to or higher than 100.

The number of electrostatic discharge protection structures 310 arranged along the total gap TG, i.e. along all longitudinal gaps G between the gate contact structure 500 and the source contact structure 700, may be equal to or higher than 3, or may be equal to or higher than 5, or may be equal to or higher than 7, or may be equal to or higher than 10, or may be equal to or higher than 15, or may be equal to or higher than 20, or may be equal to or higher than 50, or may be equal to or higher than 100.

According to an embodiment, the total number of the electrostatic discharge protection structures (310) arranged along all gaps or longitudinal gaps (G) forming the total gap (TG) is equal to or higher than 3, or 5, or 7, or 10, or 15, or 20, or 50, or 100, and wherein the total number of the gate interconnecting structures 320 arranged along all gaps or longitudinal gaps (G) forming a total gap (TG) is equal to or higher than 3 or 5, or 7, or 10, or 15, or 20, or 50, or 100.

Thus, according to an embodiment, electrostatic discharge protection structures 310 are not only integrated in a gate pad region of the gate pad 520, but are also prolongated into an edge termination area 900. According to an embodiment, a monolithic integration of a polysilicon Zener diode between source and gate runner metallization in a high voltage edge termination area of a power device is provided without spending additional chip area or at least with minimized area adder. For the modelling and for reliability of switching behaviour of the power chips it is important, that the capacitive and resistive network of the power chip system (metallization, contacts, gate runner, gate polysilicon stripes) stays unchanged when selling products with and without Zener diodes to the market. Therefore, a design of a Zener diode in an edge termination area between gate runner and source metal pad is proposed that alternates with interruptions of the Zener diode, where the regular gate poly connects the metal gate runner with the gate poly in an active chip area.

Figure 7:
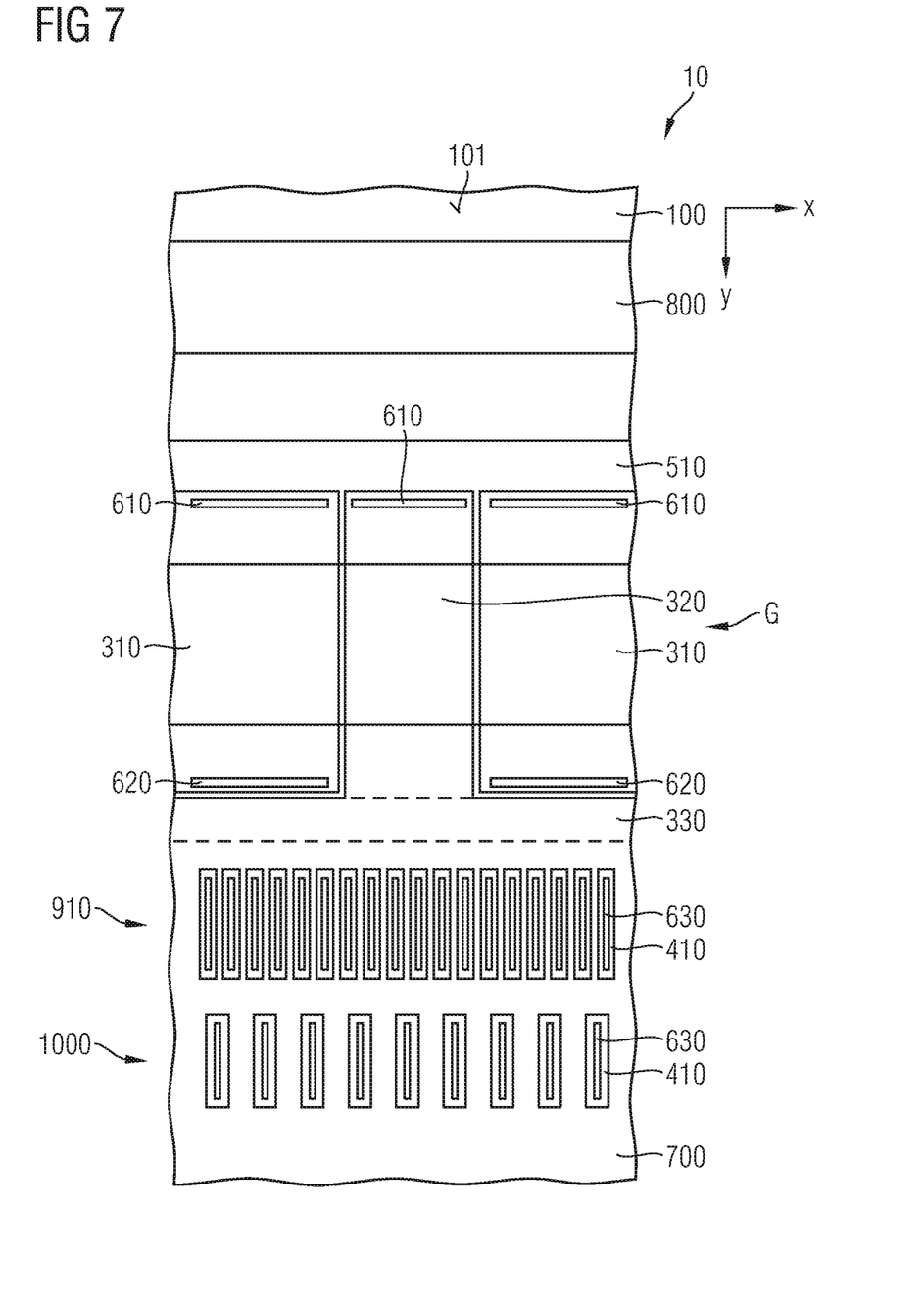
FIGS. 7 and 8 are schematic plan views of sectional portions C and D of a semiconductor device of FIG. 6.
Figure 8:
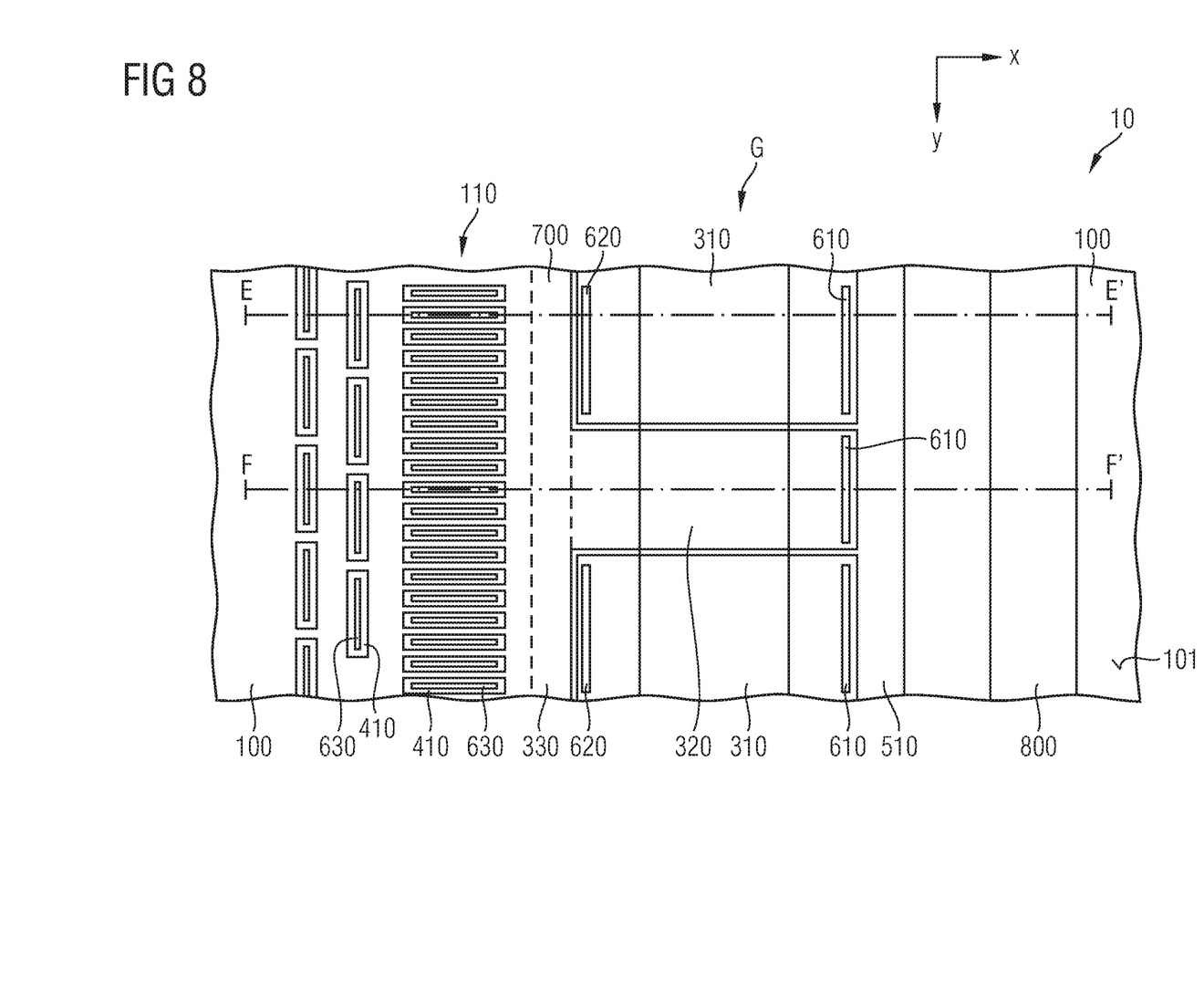

FIGS. 7 and 8 are schematic plan views of sectional portions C and D of a semiconductor device 10 of FIG. 6. In these Figures, the layout principle of the construction according to an embodiment is demonstrated. The electrostatic discharge protection structure 310, which may be formed as a Zener diode (Zener polysilicon with n- and p-implants) may be contacted between the gate line 510 or gate ring and the source contact structure 700 or source via the first and second electric contact structures 610, 620, which may be formed as poly plugs or metal contacts. In order to allow a gate signal flow from the gate line 510 or gate runner to the active gate polysilicon of the gate electrode 330 via the gate interconnecting structures 320 comprising polysilicon, the electrostatic discharge protection structure 310 have to be interrupted in regular intervals by the gate interconnecting structures 320. Since there is at least 10 µm wide polysilicon layer in the gate electrode 330 before the small polysilicon bridges of gate current distributing cells 910, the gate current can still distribute homogeneously all over the active area of the gate electrode 330 as in a standard edge design without an electrostatic discharge protection structure.

Figure 9:
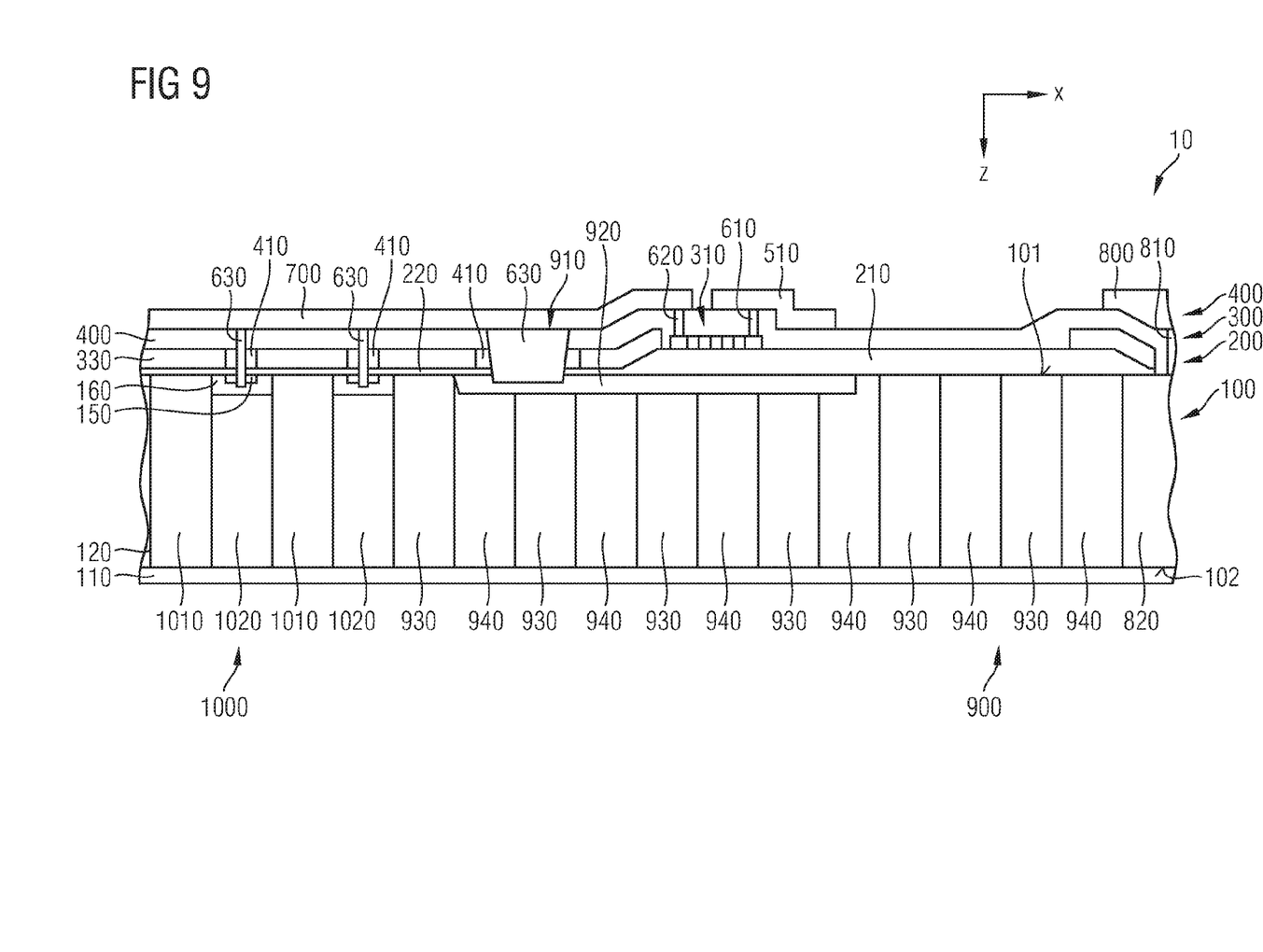
FIGS. 9 to 10 are schematic cross-sectional views of portions of a semiconductor device taken along the section planes E-E' and F-F' of FIG. 8, respectively.
Figure 10:
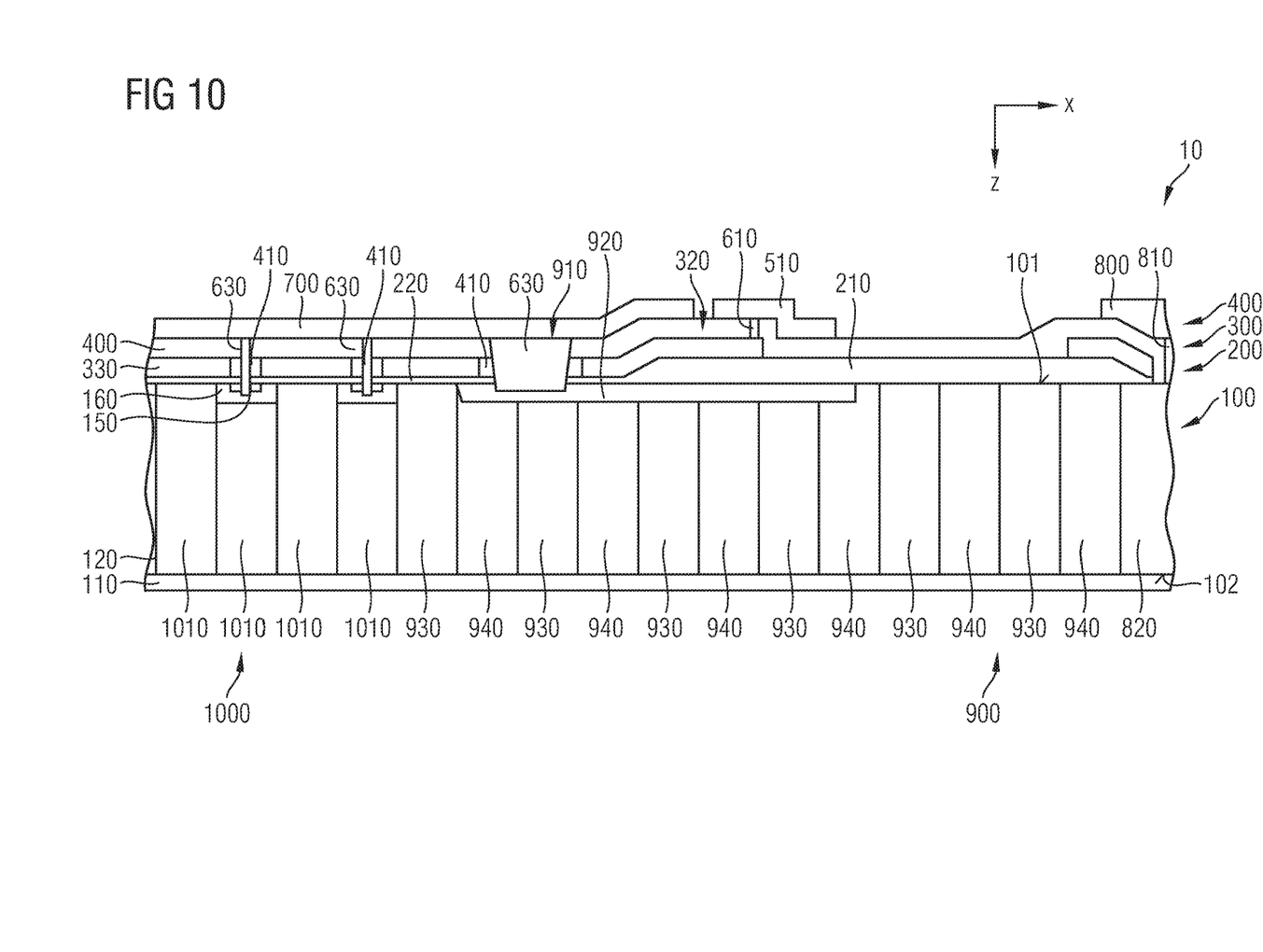

The gate current distributing cells 910 comprise third electric contact structures 630 between a source contact structure 700 and a well region 920, as can be seen from. FIGS. 9 and 10. As can be further seen from comparison of FIG. 7 and FIG. 8, the third electric contact structures 630 for connecting the source contact structure 700 with the source regions 150 are formed as interrupted stripes being extended perpendicular to a first lateral direction x, whereas the gate current distributing cells 910 are arranged as longitudinally extended third electric contact structures 630 being arranged in parallel to corresponding gate interconnecting structures 320 and electrostatic discharge protection structures 310.

Thus, according to FIG. 7 showing a detailed section C of FIG. 6, the layout construction of the electrostatic discharge protection structures 310 and the gate interconnection structures 320 is such in the edge termination area 900 that the gate line 510 or gate runner being extended along the first lateral direction x is perpendicular to the stripes of the third electric contact structure 630 of the transistor cells 1100 of the transistor structure 1000.

According to FIG. 8 showing a detailed section D of FIG. 6, the layout construction of the electrostatic discharge protection structures 310 and the gate interconnecting structures 320 is such that the gate line 510 or the gate runner extended along a second lateral direction y (being perpendicular to the first lateral direction x) is parallel to the stripes of the third electric contact structures 630 of the transistor cells 1100 of the transistor structure 1000.

FIGS. 9 and 10 are schematic cross-sectional views of portions of a semiconductor device 10 taken along the section planes E-E' and F-F' of FIG. 8, respectively. As can be seen from the comparison of FIGS. 9 and 10, FIG. 9 depicts a cross-sectional view of a portion including one of the electrostatic discharge protection structures 310, whereas FIG. 10 depicts a cross-sectional view of a portion including one of the gate interconnecting structures 320. In the following, only features of the semiconductor device 10, which have not yet been described with regard to FIG. 2 to 5, will be described.

As can be seen from FIG. 9 and FIG. 10, the third electric contact structures 630 vertically extend along the vertical direction z through the second isolation layer 400 and the gate electrode 330, which is formed by the polysilicon layer 300, and the first isolation layer 200 into the semiconductor body 100, to electrically connect the source contact structure 700 with the source regions 150. To prevent a shortcut between the third electric contact structures 630 and the gate electrode 330, contact holes being extended through the gate electrode 330 are further isolated by an dielectric lining layer 410.

The third electric contact structures 630 of the gate current distributing cells 910 are extended through the second isolation layer 400, the gate electrode 330 having the dielectric lining layer 410 for insulating the third electric contact structure 630 from the gate electrode 330, and the first isolation layer 200 into the semiconductor body 100, to contact the source contact structure 700 with the well region 920 of a second conductivity type. The conductivity types of the source regions 150, the body regions 160 or further structures of the transistor cells 1100 may be as described above with regard to FIG. 5.

As can be further seen from FIGS. 9 and 10, the electrostatic discharge protection structures 310 and the gate interconnection structures 320 are formed on the field dielectric layer 210 within the edge termination area 900 of the semiconductor device 10. In other words, the first isolation layer 200 is formed as a gate dielectric 220 within the active area of the transistor structure 1000, whereas the first isolation layer 200 is formed as a field dielectric layer 210 within the edge termination area 900. Furthermore, columns or bubbles 1010 of the first conductivity type and columns or bubbles 1020 of the second conductivity type may be implemented beneath the active transistor cell field of the transistor structure 1000. In addition, columns or bubbles 930 of the first conductivity type and columns or bubbles 940 of the second conductivity type may be implemented beneath the well region 920 of the edge termination area 900.

FIGS. 9 and 10 show thus principle cross-sectional views of an edge termination construction with an integrated Zener diode and an alternating interruption of the diode, where the gate ring or gate runner or gate line 510 is connected to the active gate polysilicon layer or gate electrode 330 in the active area of the transistor structure 1000 such as in a standard edge termination area. In the region of the gate current distributing cells 910, the active gate polysilicon layer of the gate electrode 330 is arranged in stripes that allow for source contacts.

The alternating sequence of Zener diode and gate connection can be used around the whole chip and enables much higher diode width than in the case where the diode is arranged only around 2 or 3 sides of the gate pad 520. The increased diode width leads to enhanced ESD-HBM (electrostatic discharge—human body model) capability at the same or at least nearly the same chip area in case the diode length has to be chosen so that the standard edge termination length as not increased. Assuming a breakdown current of 1 mA per μm diode width, a robustness of the electrostatic discharge protection structures 310 with respect to HBM (Human Body Model) tests may be in a range of 200 V to 5 kV.

According to an embodiment, edge portions of the gate interconnecting structures 320 and edge portions of the electrostatic discharge protection structures 310 are each arranged along a same line parallel to the length direction L of the longitudinal gap G. By providing edge portions of the gate interconnecting structures 320 and the electrostatic discharge protection structures 310 being flush with each other, a homogenous termination of the polysilicon layer 300 constituting the gate interconnecting structures 320 and the electrostatic discharge protection structures 310 and forming, at the same time, a field plate structure, may be achieved. Thus, a homogenous electric field in the edge termination area 900 may be achieved.

In addition, the first electric contact structure 610 electrically connecting the first terminals 312 of the electrostatic discharge protection structures 310 and the terminals 322 of the gate interconnecting structures 320 with the gate contact structure 500 may be longitudinally extended along the length direction L of the longitudinal gap G while being interrupted along the length direction L of the longitudinal gap G to separately electrically contact the electrostatic discharge protection structures 310 and the gate interconnecting structures 320. Thus, the first contact structure 610 may be longitudinally extended and interrupted along the length direction L of the longitudinal gap G to separately electrically contact the electrostatic discharge protection structures 310 and the gate interconnecting structures 320. By providing the first electrical contact structure 610 being longitudinally extended along the length direction L of the longitudinal gap G, a homogenous electrical contact structure of the gate interconnecting structures 320 and the electrostatic discharge protection structures 310 may be achieved. Thus, a homogenous electric field in the edge termination area 900 may be achieved.

As can be further seen from FIGS. 9 and 10, the drain line 800 is connected to a drain connection column 820 within the semiconductor body 100 by means of a fourth electric contact structure 810, which is vertically extended through the second isolation layer 400, the polysilicon layer 300 and the first isolation layer 200 into the semiconductor body 100. The drain connection column 820 are of a first conductivity type and are extended from the first surface 101 to the second surface 102 of the semiconductor body 100, to contact the drain region 110 on the second surface 102 with the drain line 800 formed over the first surface 101 of the semiconductor body 100.

Figure 11:
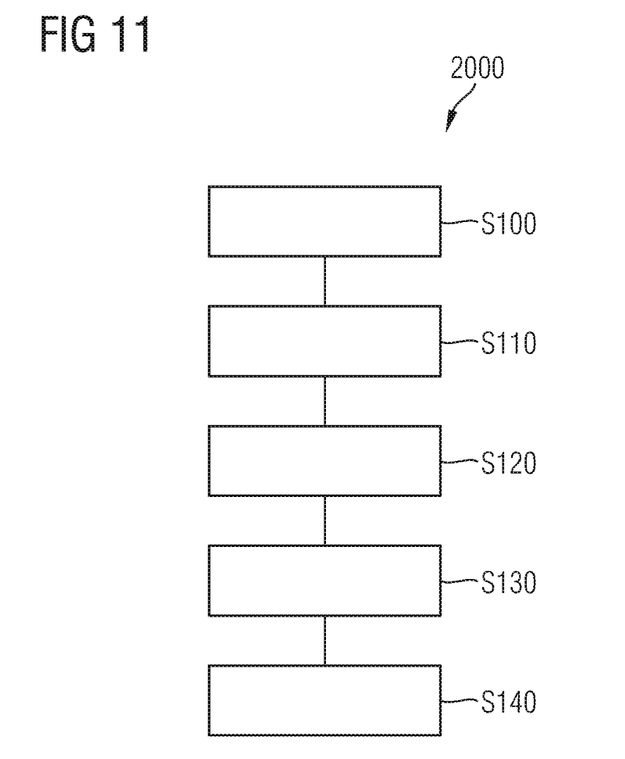
FIG. 11 is a schematic process chart of a method of manufacturing a semiconductor device in accordance with an embodiment.

FIG. 11 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

A schematic flow diagram for illustrating a method 2000 of manufacturing a semiconductor device is depicted in FIG. 11.

Process feature S100 comprises forming a transistor structure in a semiconductor body having a first surface and a second surface opposite to the first surface.

Process feature S110 comprises forming a source contact structure overlapping the transistor structure, wherein the source contact structure is electrically connected to source regions of the transistor structure.

Process feature S120 comprises forming a gate contact structure having a part separated from the source contact structure by a longitudinal gap within a lateral plane.

Process feature S130 comprises forming gate interconnecting structures bridging the longitudinal gap and electrically coupled between the gate contact structure and a gate electrode of the transistor structure.

Process feature S140 comprises forming electrostatic discharge protection structures bridging the longitudinal gap and electrically coupled between the gate contact structure and the source contact structure, wherein at least one of the gate interconnecting structures is between two of the electrostatic discharge protection structures along the length direction of the longitudinal gap.

One advantage of the possible integration of the electrostatic discharge protection structures 310 in the edge termination area 900 and not around the gate pad 520 may be the fact that the gate pad 520 could also be arranged on a gate oxide or gate dielectric layer 220 or be even used as an active gate pad. An active gate pad structure is an embodiment of a semiconductor device, in which the semiconductor device 10 further comprises a transistor structure 1000 formed in an overlapping area of the gate contact structure 500 and the second surface 102 of the semiconductor body 100. By such a structure, the total chip size is further reduced keeping the same electrical performance like before.

According to an embodiment, electrostatic discharge protection structures 310 are monolithically integrated in a high voltage edge termination. The diode width can be at least 50% or 30% of the edge termination width, which provides high HBM-ESD-capabilities (>1 kV; even for small product chips with an active area of 0.5 mm$^2$. Thus, the electrostatic discharge protection capability is significantly larger as compared to electrostatic discharge protection structures integrated only in a gate pad 520 between source and gate metallization. Since such an embodiment is a pure design measure, there is no increase in process cost.

A former edge termination topology and total chip area of a semiconductor device 10 stays nearly unchanged due to the nearly identical RC gate network of gate polysilicon, metallization and contact topology of the transistor layout. This has advantages concerning the—identical—switching behaviour of power MOSFET devices both with and without Zener diodes.

The edge termination structure according to an embodiment with integrated electrostatic discharge protection structures 310 is also applicable for power technology with trench gates and IGBT's. An additional advantage can be seen in that the electrostatic discharge protection structures 310 are placed in the transistor high voltage edge termination area 900. Because of this, the gate pad region needs no field oxide anymore. This means, that active gate pad devices can be integrated even with very high ESD robustness.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body having a first surface and a second surface opposite to the first surface;
a transistor structure in the semiconductor body;
a source contact structure overlapping the transistor structure and electrically connected to source regions of the transistor structure;
a gate contact structure having a part separated from the source contact structure by a longitudinal gap within a lateral plane;
gate interconnecting structures bridging the longitudinal gap and electrically coupled between the gate contact structure and a gate electrode of the transistor structure; and
electrostatic discharge protection structures bridging the longitudinal gap and electrically coupled between the gate contact structure and the source contact structure, wherein at least one of the gate interconnecting structures is between two of the electrostatic discharge protection structures along a length direction of the longitudinal gap.

2. The semiconductor device of claim 1, wherein the gate contact structure comprises a gate pad, and wherein the longitudinal gap is between a part of the gate pad and the source contact structure.

3. The semiconductor device of claim 1, wherein the gate contact structure comprises a gate line, and wherein the longitudinal gap is between a part of the gate line and the source contact structure.

4. The semiconductor device of claim 3, wherein the gate line at least partly surrounds the source contact structure within the lateral plane.

5. The semiconductor device of claim 1, wherein the longitudinal gap is formed in an edge termination area.

6. The semiconductor device of claim 1, wherein the source contact structure and the gate contact structure are patterned parts of a same conductive material.

7. The semiconductor device of claim 1, wherein at least two gate interconnecting structures and at least three electrostatic discharge protection structures are arranged along the length direction of the longitudinal gap.

8. The semiconductor device of claim 1, wherein an extension of each of the electrostatic discharge protection structures along the length direction of the longitudinal gap is less than 50 µm.

9. The semiconductor device of clam 1, wherein edge portions of the gate interconnecting structures and edge portions of the electrostatic discharge protection structures are each arranged along a same line parallel to the length direction of the longitudinal gap.

10. The semiconductor device of claim 1, wherein the gate interconnecting structures are formed as comb segments protruding from an electrode layer of the gate electrode in a lateral plane.

11. The semiconductor device of claim 1, wherein the gate interconnecting structures comprise a polysilicon layer.

12. The semiconductor device of claim 1, wherein the gate interconnecting structures and the electrostatic discharge protection structures are distinct parts of a same patterned polysilicon layer.

13. The semiconductor device of claim 1, wherein the electrostatic discharge protection structures comprise at least one polysilicon diode.

14. The semiconductor device of claim 1, wherein the electrostatic discharge protection structures comprise a polysilicon layer having first and second regions of opposite conductivity type alternatingly arranged along a lateral direction which is perpendicular to the length direction of the longitudinal gap.

15. The semiconductor device of claim 1, further comprising a first isolation layer on the first surface of the semiconductor body, wherein the electrostatic discharge protection structures and the gate interconnecting structures abut the first isolation layer.

16. The semiconductor device of claim 15, wherein the first isolation layer comprises a field dielectric layer.

17. The semiconductor device of claim 15, further comprising a second isolation layer on the electrostatic discharge protection structures and the gate interconnecting structures, wherein the source contact structure and the gate contact structure are formed on the second isolation layer.

18. The semiconductor device of claim 15, wherein first terminals of the electrostatic discharge protection structures and terminals of the gate interconnecting structures are electrically connected with the gate contact structure by first electric contact structures and second terminals of the electrostatic discharge protection structures are electrically connected with the source contact structure by second electric contact structures, the first and second electric contact structures extending along a vertical direction through the second isolation layer.

19. The semiconductor device of claim 1, further comprising a transistor structure formed in an overlapping area of the gate contact structure and the second surface of the semiconductor body.

20. A semiconductor device, comprising:
a semiconductor body having a first surface and a second surface opposite to the first surface;
a transistor structure in the semiconductor body;
a source contact structure overlapping the transistor structure and electrically connected to source regions of the transistor structure;
a gate contact structure having a part separated from the source contact structure by a gap within a lateral plane;
gate interconnecting structures bridging the gap and electrically coupled between the gate contact structure and a gate electrode of the transistor structure; and
electrostatic discharge protection structures bridging the gap and electrically coupled between the gate contact structure and the source contact structure;
wherein the total number of the electrostatic discharge protection structures arranged along all longitudinal gaps between the gate contact structure and the source contact structure is equal to or higher than 3, and wherein the total number of the gate interconnecting structures arranged along all longitudinal gaps between the gate contact structure and the source contact structure is equal to or higher than 3.

* * * * *